(12) United States Patent
McHugh et al.

(10) Patent No.: US 7,118,401 B2
(45) Date of Patent: Oct. 10, 2006

(54) ELECTRICAL CONNECTOR WITH CONTINUOUS SUPPORT MEMBER

(75) Inventors: Robert G. McHugh, Golden, CO (US); Sung-Pei Hou, Tu-Chen (TW); Yao-Chi Huang, Tu-Chen (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 7 days.

(21) Appl. No.: 10/860,430

(22) Filed: Jun. 2, 2004

(65) Prior Publication Data

US 2005/0272295 A1   Dec. 8, 2005

(51) Int. Cl.
   *H01R 13/62*   (2006.01)
(52) U.S. Cl. ....................................... 439/330
(58) Field of Classification Search ............... 439/330, 439/71, 526, 70, 525, 66, 83, 862, 575
   See application file for complete search history.

(56) References Cited

U.S. PATENT DOCUMENTS

| | | | |
|---|---|---|---|
| 4,504,105 A | 3/1985 | Barkus et al. | |
| 4,621,884 A | 11/1986 | Berkebile, Jr. et al. | |
| 5,302,853 A | 4/1994 | Volz et al. | |
| 6,210,176 B1 * | 4/2001 | Hsiao | 439/71 |
| 6,848,936 B1 * | 2/2005 | DeFord | 439/526 |
| 6,905,377 B1 * | 6/2005 | Murr | 439/862 |
| 2002/0111052 A1 * | 8/2002 | Noda et al. | 439/71 |

* cited by examiner

*Primary Examiner*—J. F. Duverne
(74) *Attorney, Agent, or Firm*—Wei Te Chung

(57) ABSTRACT

An electrical connector includes a housing (2). A floor (20) is defined in a middle of the housing and a plurality of side walls (22) is defined therearound. The side walls and the floor cooperatively define a substantially rectangular cavity (24) therebetween. A plurality of passageways (26) is defined in the floor for receiving a corresponding number of electrical contacts (3) therein. Each contact includes an arm (30) extending beyond the floor for contacting with corresponding contacting pad of the LGP (4). All the arms extend in a plurality of rows, parallel to one diagonal of the floor, and the arms in a same row are arranged side by side. Each passage includes an upper receiving portion extending into an adjacent passage in the same line, therefore, the passages in the same line are stringed, and a continuous support member is formed between two rows of stringed passages.

12 Claims, 6 Drawing Sheets

ELECTRICAL CONNECTOR WITH CONTINUOUS SUPPORT MEMBER

BACKGROUND OF THE INVENTION

1. Field of the Invention

The present invention relates to an electrical connector for electrically connecting an electronic package such as an integrated circuit (IC) chip with a circuit substrate such as a printed circuit board (PCB), and particularly to a connector adapted for receiving a land grid package (LGP) therein and electrically connecting the LGP with a PCB.

2. Description of the Prior Art

Land grid array (LGA) connector for connecting a Land Grid Package (LGP) with a printed circuit board (PCB) is widely used in the field of electrical connectors.

Conventional Land Grid Array (LGA) connector comprises an insulative base mounted on a printed circuit board, a metal clip pivotably engaged on one end of the base, and a lever engaged on an opposite end of the base for fastening the clip onto the base. The base is substantially rectangular. A floor is defined in a middle of the base and a plurality of side walls is defined around the floor. The side walls and the floor cooperatively define a substantially rectangular cavity therebetween. A plurality of passageways is defined in the floor, for receiving a corresponding number of electrical contacts therein. Each contact comprises an arm extending beyond the floor of the housing for electrically contacting with corresponding contacting pad of an LGP. Examples of this kind of electrical connectors are also disclosed in U.S. Pat. Nos. 4,504,105, 4,621,884, and 5,302,853.

In use, the LGP is inserted into the cavity and the pads mates with the extending out arms of the contacts. After the insertion, the arms are pressed by the contacting pads of the LGP, and resiliently deform towards the floor of the housing. However, the arms of the contacts are liable accidentally damaged under long time pressure of the LGP, for no supporting member.

Referring to FIG. 6, an improved LGA connector is provided for preventing the arms 60 from being damaged. In this type of LGA connector, a plurality of protrusions 61 is defined among the exposed arms, and each protrusion 61 is separated from each other. The arms 60 of the adjacent contacts extend substantially parallel to a direction of one diagonal of the rectangular floor 63, and any two adjacent arms do not extend in a same line. In use, the protrusions 61 and the contacting portions of the contacts cooperatively support the LGP. Therefore, risk of damaging the contacts is decreased.

However, one problem with this type of LGA connector is that the separated protrusions will be probably pressed damaged by the LGP, for the limited strength of separate protrusion and the relatively high pressure from LGP.

In view of the above, a new electrical connector which overcomes the above-mentioned disadvantages is desired.

SUMMARY OF THE INVENTION

Accordingly, an object of the present invention is to provide an electrical connector for electrically connecting an LGP with a PCB, and particularly to an LGA connector having a housing configured to minimize the risk of damage to the arms of the contacts and the housing.

To achieve the above-mentioned object, an electrical connector in accordance with the present invention comprises an substantially rectangular insulative housing mounted on a printed circuit board. A floor is defined in a middle of the housing and a plurality of side walls is defined around the floor. The side walls and the floor cooperatively define a substantially rectangular cavity therebetween. A plurality of passageways is defined in the floor, for receiving a corresponding number of electrical contacts therein. Each contact comprises an arm extending beyond the floor of the housing for contacting with corresponding contacting pad of the LGP. Each arm extends parallel to a direction of one diagonal of the floor, and all the arms in the same direction are arranged side by side, and substantially extend in the same line. Each passage comprises an upper receiving portion extending into an adjacent passage that is in the same line, therefore, the passages in the same line are stringed, and a continuous support member is formed between two rows of stringed passages in said direction.

When the LGP is pressed onto the housing of the connector, the arms of the contacts, together with the continuous support members cooperatively support the LGP. The continuous support members each have enough strength to sustain the pressure of the LGP and protect the arms from being damaged. Therefore, reliable mechanical and electrical performance of the connector is achieved.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
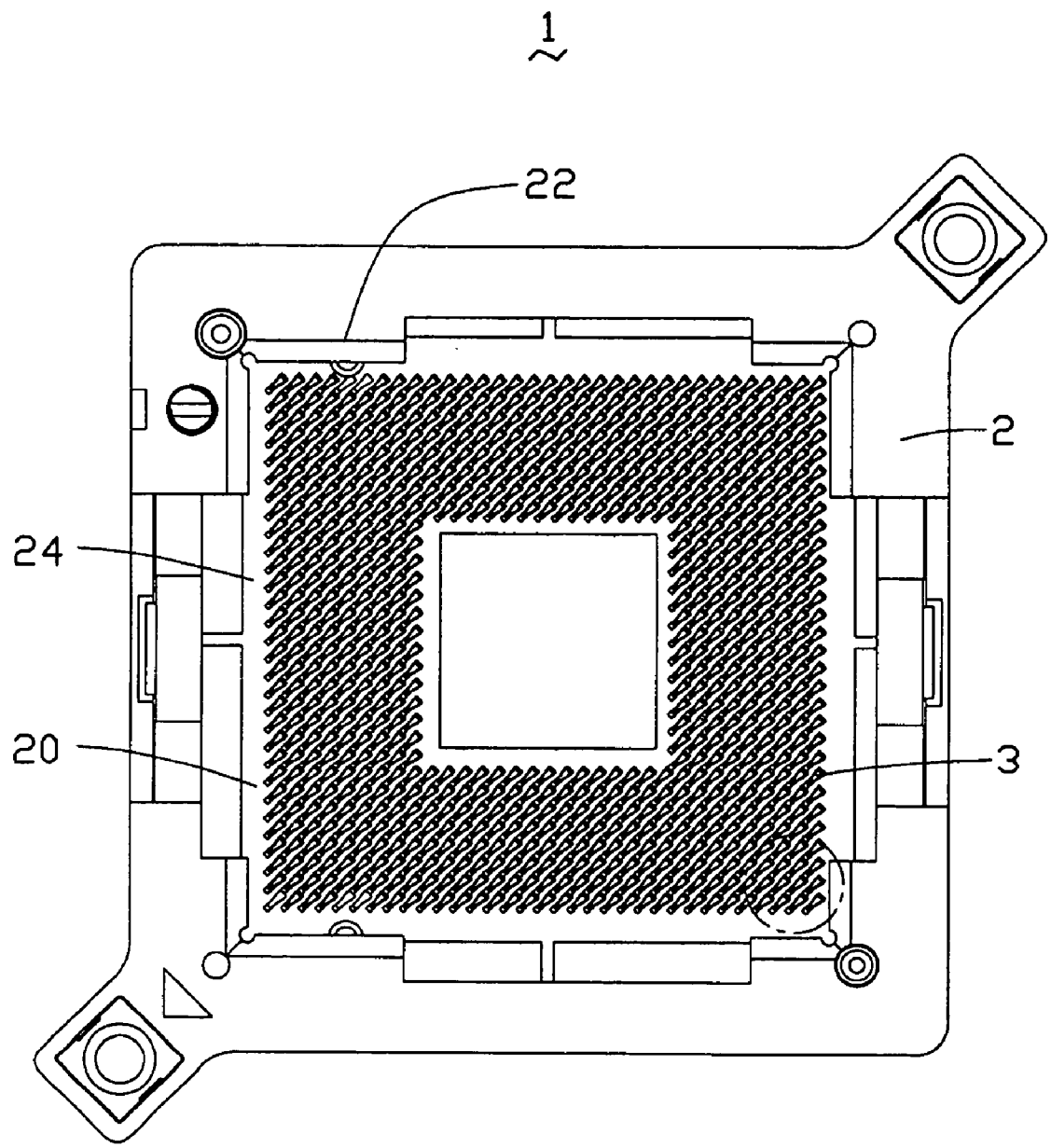
FIG. 1 is a top plan view of an electrical connector in accordance with the embodiment of the present invention.
Figure 2:
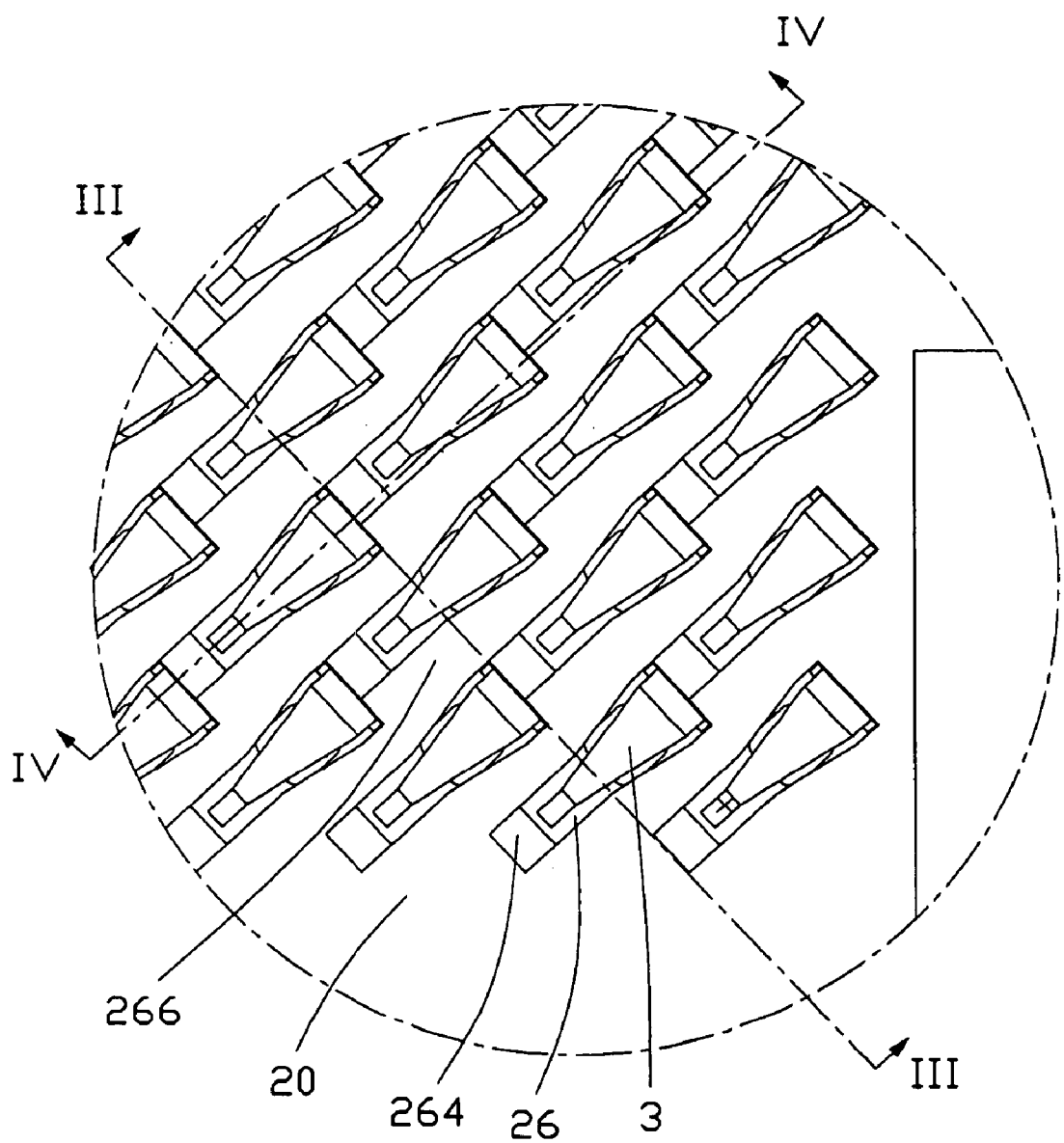
FIG. 2 is an enlarged view of a circled portion II of FIG. 1.

Referring to FIGS. 1–2, an electrical connector 1 in accordance with the embodiment of the present invention comprises an insulative housing 2 mounted on a printed circuit board (not shown), and a plurality of contacts 3 received in the housing 2. A Land Grid Package 4 (referring to FIG. 4) is pressed onto the housing 2 for connecting with the printed circuit board via the connector 1.

The housing 2 is substantially rectangular. A floor 20 is defined in a middle of the housing 2 and a plurality of side walls 22 is provided around a periphery of the floor 20. The side walls 22 and the floor 20 cooperatively define a substantially rectangular cavity 24 therebetween. A plurality of passageways 26 is defined in the floor 20, for receiving a corresponding number of electrical contacts 3 therein.

The passages 26 is arranged in the housing 2 in a matrix manner. The passage 26 comprises a securing portion 262 (referring to FIG. 3) for engagingly receiving the contact 3 and an upper receiving portion 264 for accommodating the arms 30 of the contact 3. The receiving portion 264 extends into an adjacent passage 26, and therefore the two adjacent passages 26 are stringed by the receiving portions 264. The stringed passages 26 are arranged parallel to one diagonal of the rectangular floor 20. All the passages 26 are arranged to several rows parallel to or along said diagonal, and the passages in the same row are substantially stringed in a same line.

Figure 3:
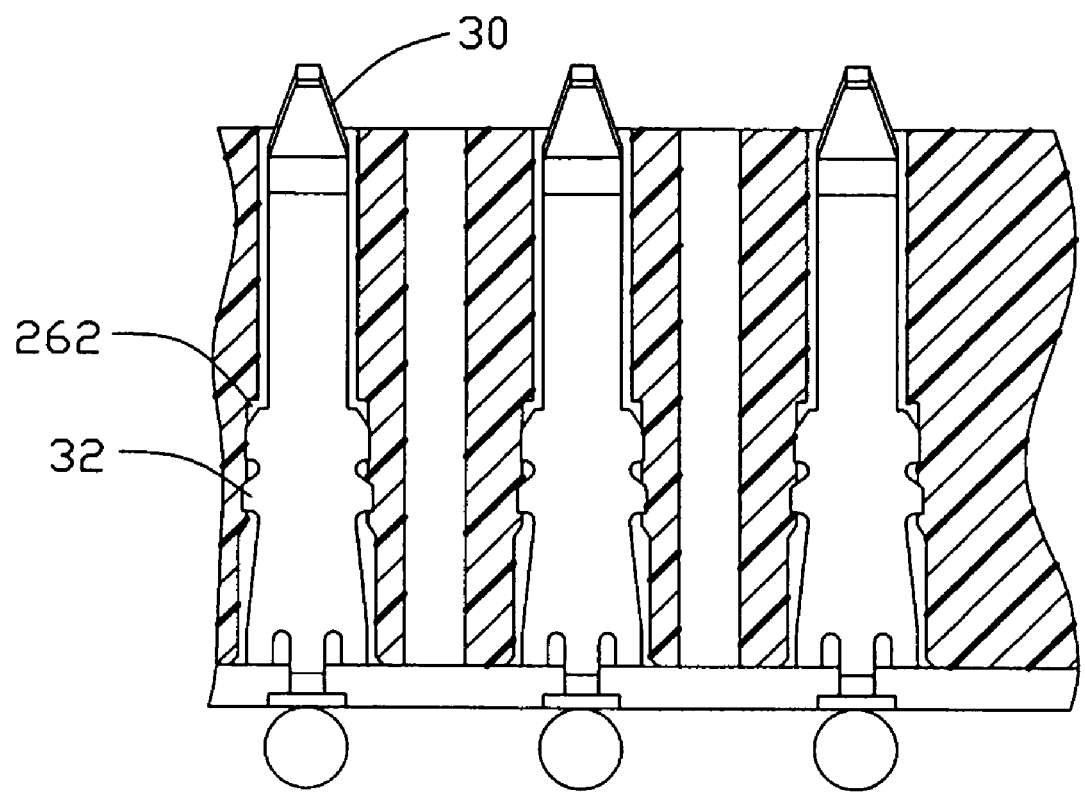
FIG. 3 is a cross-sectional view along a line III—III of FIG. 2.
Figure 4:
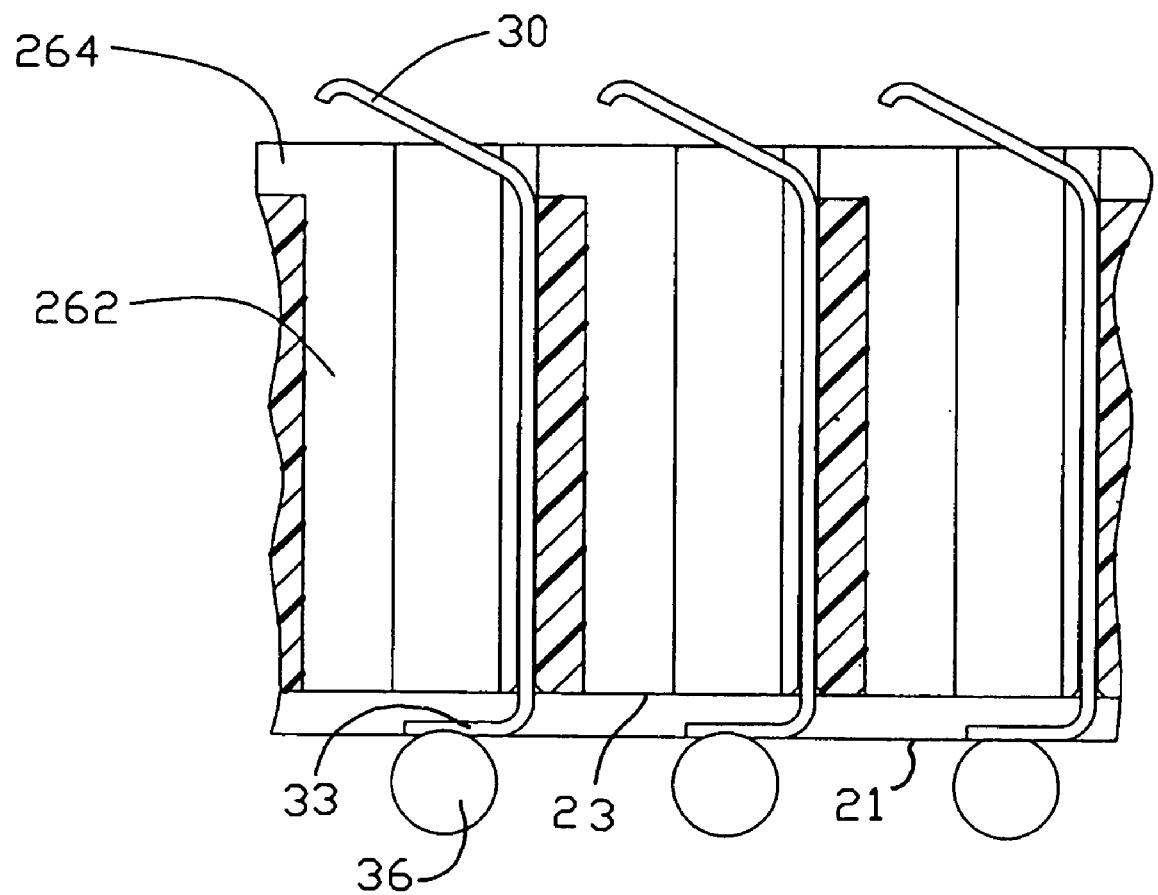
FIG. 4 is a cross-sectional view along a line IV—IV of FIG. 2.
Figure 5:
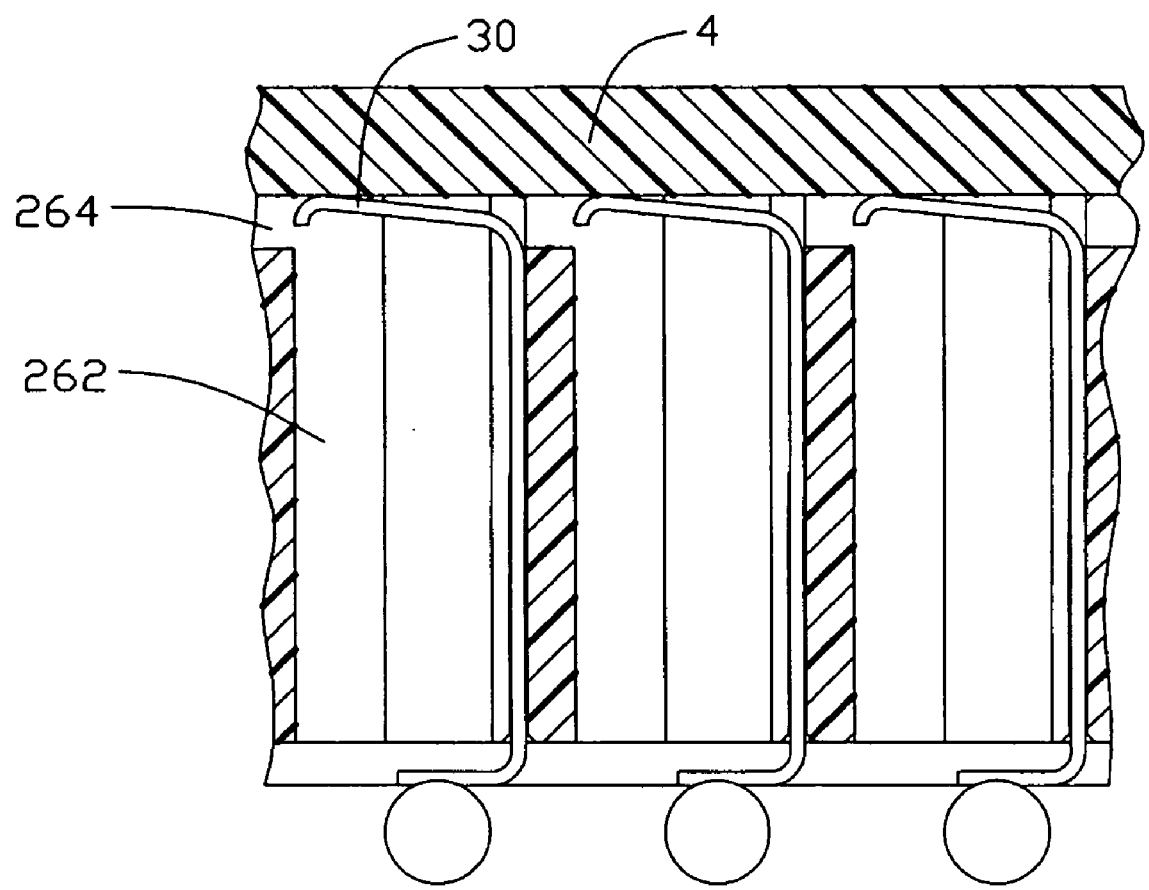
FIG. 5 is similar to FIG. 4, but showing an LGP pressed onto a housing of the electrical connector.
Figure 6:
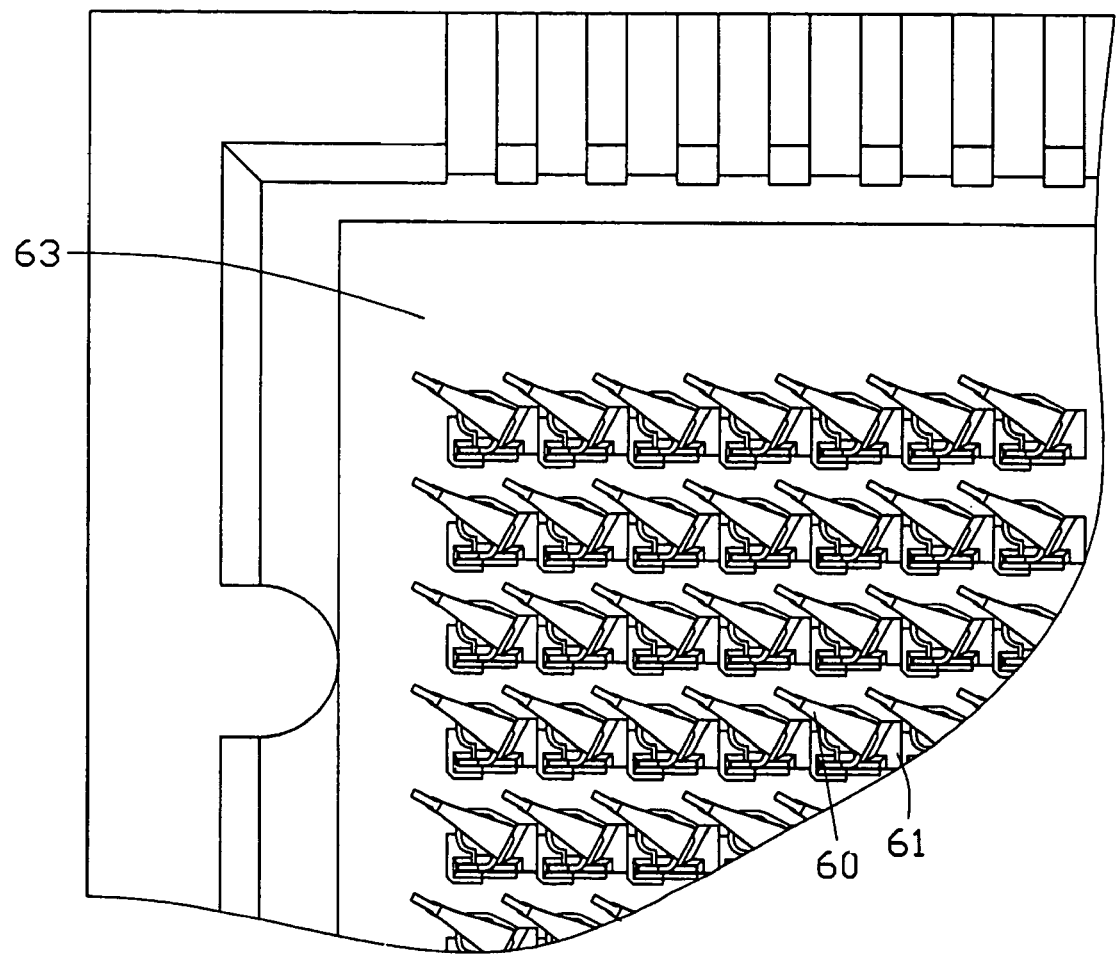
FIG. 6 is a partial top plan view of a conventional electrical connector.

Referring to FIGS. 3–5, the contact 3 comprises an arm 30 extending beyond the floor 20 of the housing 2. The arms 30 extend parallel to or along the diagonal of the rectangular floor 20, and are aligned with the receiving portions 264 of the passages 26, respectively. All the arms 30 in a same line are arranged side by side, and the different lines of arms are parallel to each other. The contact 3 further comprises a plurality of engaging bars 32 for engaging with the engaging securing portion 262 of the passage 2.

In this arrangement of the passages, a continuous support member 266 is formed between two adjacent lines of passages 26. The support members 266 have enough strength to sustain the LGP.

In use, the housing 2 is mounted on the printed circuit board, and the contacts 3 are secured in corresponding passages 26 of the housing 2. The arms 30 extend beyond the floor 20 of the housing 2. When the LGP is pressed into the cavity 24 of the housing, the contacting pads of the LGP press the arms 30 of the contacts 3, and the LGP moves downwardly until the lower surface of the LGP touches the floor 20 of the housing 2. When the LGP is in final assembled position, the continuous support member 266 between adjacent rows passages 26 supports the LGP, and the contacting portions 300 of the contacts 3 are pressed into corresponding receiving portions 264 of the passages 26. Because the support member 266 is continuous, it has enough strength to support the LGP and protect the contact 3 from being damaged. Therefore, reliable mechanical and electrical performance of the connector is achieved.

It is noted that the housing 2 defines a reference plane 21 with which the right angle mounting portion 33 of the contact 3 is flush and the solder ball 36 is attached to the underside of the mounting portion 33. To increase ventilation during reflow of the solder ball 36, the through type passage 26 purposely terminates at the plane 23 which is higher than the reference plane 21. This arrangement, i.e., the mounting portion 33 extending beyond the bottom end of the passage 26, also provides more flexibility of the mounting portion 33 alone with the associated solder ball 34 relative to the housing 2 so as to forgive different coefficients of thermal expansion (CTE) between the housing 2 and the printed circuit board on which the housing 2 is seated, thus preventing breakage/crack of the solder ball 34.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for interconnecting an integrated circuit chip and a printed circuit board, the electrical connector comprising:
a housing comprising a cavity for receiving the integrated circuit chip, the cavity being bounded by a floor and a plurality of peripheral side walls, a plurality of passages being arranged in the floor;
a plurality of contacts received in the passages, the contacts each comprising an arm extending beyond the floor for electrically contacting with the integrated circuit chip;
wherein all the passages are arranged side by side in a plurality of parallel rows, each passage comprises an receiving portion extending into an adjacent passage in a same row, and a continuous support member is formed between two rows of passages for supporting the integrated circuit chip.

2. The electrical connector as claimed in claim 1, wherein the cavity is substantially rectangular, and each row of passages is parallel to one diagonal of the rectangular cavity.

3. The electrical connector as claimed in claim 2, wherein the receiving portions are defined in the upper surface of the floor, and the arms extends alignedly with the receiving portions of the passages.

4. The electrical connector as claimed in claim 3, wherein all the arms of the contacts in a row extend substantially in a line.

5. The electrical connector as claimed in claim 4, wherein the lines of arms extend parallel to said diagonal of the rectangular floor.

6. The electrical connector as claimed in claim 1, wherein the continuous support members and the arms of the contact cooperatively support the integrated circuit chip.

7. An electrical connector assembly for interconnecting an integrated circuit chip and a printed circuit board, the electrical connector comprising:
a housing comprising a floor and a plurality of side walls, the floor and the side walls cooperatively defining a substantially rectangular cavity therebetween, a plurality of passages being arranged in the floor;
a plurality of contacts arranged in the housing, the contacts each comprising an arm extending beyond the floor for contacting with the integrated circuit chip:
wherein all the arms are arranged in a plurality of rows parallel to one diagonal of the floor, all the arms in the same row are arranged side by side, and a continuous support member is formed between two rows of contacts for supporting the integrated circuit chip.

8. The electrical connector as claimed in claim 7, wherein each passage comprises an upper receiving portion extending into an adjacent passage.

9. The electrical connector as claimed in claim 8, wherein the receiving portions are defined in the upper surface of the floor, and the arms extends alignedly with the receiving portions of the passages.

10. The electrical connector as claimed in claim 9, wherein all the arms of the contacts in a row extend substantially in a same line.

11. An electrical connector comprising:
an insulative housing defining a plurality of through type passages therein in a vertical direction;
the housing defining a mounting reference plane on a bottom portion of the housing;
the passages terminating at another plane defined around bottom portions of said passages, said another plane being higher than said mounting reference plane;
a plurality of contacts disposed in the corresponding passages, respectively; and each of said contacts including a mounting portion, a solder ball being attached to an underside of said mounting portion, said mounting portion being essentially flush with said mounting reference plane.

12. The electrical connector as claimed in claim 11, wherein said mounting reference plant is of a solid type rather than an imaginary type.

* * * * *